United States Patent
Loechelt et al.

(10) Patent No.: US 8,372,716 B2
(45) Date of Patent: Feb. 12, 2013

(54) METHOD OF FORMING A SEMICONDUCTOR DEVICE HAVING VERTICAL CHARGE-COMPENSATED STRUCTURE AND SUB-SURFACE CONNECTING LAYER

(75) Inventors: Gary H. Loechelt, Tempe, AZ (US); Peter J. Zdebel, Scottsdale, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 90 days.

(21) Appl. No.: 13/099,157

(22) Filed: May 2, 2011

(65) Prior Publication Data

US 2011/0207277 A1  Aug. 25, 2011

Related U.S. Application Data

(62) Division of application No. 12/206,516, filed on Sep. 8, 2008, now Pat. No. 7,960,781.

(51) Int. Cl.
 *H01L 21/336* (2006.01)
 *H01L 29/93* (2006.01)

(52) U.S. Cl. ........ 438/270; 438/268; 438/269; 438/274; 438/357; 438/358; 438/510; 438/595; 257/329; 257/330; 257/332; 257/333; 257/339; 257/342; 257/409; 257/509; 257/510; 257/513

(58) Field of Classification Search .................. 257/329, 257/330, 332, 333, 339, 342, 409, 509, 510, 257/513, 514; 438/268, 269, 274, 357, 358, 438/510, 595
See application file for complete search history.

(56) References Cited

U.S. PATENT DOCUMENTS

| | | |
|---|---|---|
| 4,899,199 A | 2/1990 | Gould |
| 5,216,275 A | 6/1993 | Chen |
| 5,418,185 A | 5/1995 | Todd et al. |
| 5,438,215 A | 8/1995 | Tihanyi |
| 5,571,738 A | 11/1996 | Krivokapic |
| 5,859,465 A | 1/1999 | Spring et al. |
| 5,872,421 A | 2/1999 | Potter |
| 5,886,383 A | 3/1999 | Kinzer |
| 5,998,288 A | 12/1999 | Gardner et al. |

(Continued)

FOREIGN PATENT DOCUMENTS

| | | |
|---|---|---|
| WO | WO02/19433 A2 | 3/2002 |
| WO | WO2005/096389 A1 | 10/2005 |

(Continued)

OTHER PUBLICATIONS

Semiconductor Components Industries, LLC, "NUF6106FCT1, 6 Channel EMI Pi-Filter Array with ESD Protection", Data Sheet, Mar. 2004—Rev. 0, Publication Order Number: NUF6106FC/D.

(Continued)

*Primary Examiner* — Matthew W Such
*Assistant Examiner* — David Spalla
(74) *Attorney, Agent, or Firm* — Kevin B. Jackson

(57) ABSTRACT

In one embodiment, a semiconductor device is formed having vertical localized charge-compensated trenches, trench control regions, and sub-surface doped layers. The vertical localized charge-compensated trenches include at least a pair of opposite conductivity type semiconductor layers. The trench control regions are configured to provide a generally vertical channel region electrically coupling source regions to the sub-surface doped layers. The sub-surface doped layers are further configured to electrically connect the drain-end of the channel to the vertical localized charge compensation trenches. Body regions are configured to isolate the sub-surface doped layers from the surface of the device.

18 Claims, 13 Drawing Sheets

U.S. PATENT DOCUMENTS

| | | | |
|---|---|---|---|
| 6,078,090 | A | 6/2000 | Williams et al. |
| 6,184,555 | B1 | 2/2001 | Tihanyi et al. |
| 6,191,446 | B1 | 2/2001 | Gardner et al. |
| 6,210,999 | B1 | 4/2001 | Gardner et al. |
| 6,255,152 | B1 | 7/2001 | Chen |
| 6,274,904 | B1 | 8/2001 | Tihanyi |
| 6,278,165 | B1 | 8/2001 | Oowaki et al. |
| 6,355,955 | B1 | 3/2002 | Gardner et al. |
| 6,410,955 | B1 | 6/2002 | Baker et al. |
| 6,465,869 | B2 | 10/2002 | Ahlers et al. |
| 6,479,352 | B2 | 11/2002 | Blanchard |
| 6,509,240 | B2 | 1/2003 | Ren et al. |
| 6,512,267 | B2 | 1/2003 | Kinzer et al. |
| 6,541,817 | B1 | 4/2003 | Hurkx et al. |
| 6,576,516 | B1 | 6/2003 | Blanchard |
| 6,593,619 | B1 * | 7/2003 | Blanchard ................. 257/328 |
| 6,608,350 | B2 * | 8/2003 | Kinzer et al. ............... 257/341 |
| 6,664,590 | B2 | 12/2003 | Deboy |
| 6,693,338 | B2 | 2/2004 | Saitoh et al. |
| 6,710,418 | B1 | 3/2004 | Sapp |
| 6,756,273 | B2 * | 6/2004 | Hadizad et al. ............. 438/269 |
| 6,878,989 | B2 | 4/2005 | Izumisawa et al. |
| 6,919,610 | B2 | 7/2005 | Saitoh et al. |
| 6,982,193 | B2 * | 1/2006 | Hossain et al. ............. 438/135 |
| 7,002,187 | B1 | 2/2006 | Husher |
| 7,019,377 | B2 | 3/2006 | Tsuchiko |
| 7,067,394 | B2 | 6/2006 | So |
| 7,176,524 | B2 * | 2/2007 | Loechelt et al. ............. 257/341 |
| 7,253,477 | B2 | 8/2007 | Loechelt et al. |
| 7,285,823 | B2 | 10/2007 | Loechelt et al. |
| 7,411,266 | B2 * | 8/2008 | Tu et al. .................. 257/492 |
| 7,535,056 | B2 * | 5/2009 | Komachi ................... 257/331 |
| 2003/0209750 | A1 | 11/2003 | Deboy et al. |
| 2006/0024890 | A1 | 2/2006 | Calafut |
| 2007/0034947 | A1 | 2/2007 | Loechelt et al. |
| 2007/0052061 | A1 | 3/2007 | Deboy et al. |
| 2007/0222019 | A1 * | 9/2007 | Rochefort et al. ........... 257/493 |
| 2007/0278565 | A1 | 12/2007 | Tu et al. |

FOREIGN PATENT DOCUMENTS

WO    WO2006/025035 A2    3/2006

OTHER PUBLICATIONS

M. Rub, D. Ahlers, J. Baumgartl, G. Deboy, W. Friza, O. Haberlen and I. Steinigke, "A Novel Trench Concept for the Fabrication of Compensation Devices," pp. 203-206., ISPSD Apr. 14-17, 2003, Cambridge, UK.

Deboy, G., et al., "A new Generation of High Voltage MOSFETs Breaks the Limit Line of Silicon", IEDM '98, Dec. 6-9, 1998, p. 683-5.

Lorenz, L., et al., "COOLMOS (TM)—a new Milestone in High Voltage Power MOS", ISPSD '99, May 26-28, 1999, p. 3-10.

* cited by examiner

METHOD OF FORMING A SEMICONDUCTOR DEVICE HAVING VERTICAL CHARGE-COMPENSATED STRUCTURE AND SUB-SURFACE CONNECTING LAYER

CROSS-REFERENCE TO RELATED APPLICATIONS

The present application is a divisional application of prior U.S. Pat. No. 7,960,781, filed on Sep. 8, 2008, which is hereby incorporated by reference, and priority thereto for common subject matter is hereby claimed. This application is related to U.S. Pat. No. 7,902,075 entitled "SEMICONDUCTOR TRENCH HAVING A SEALING PLUG AND METHOD" having a common assignee, and a common inventor, which was filed concurrently with U.S. Pat. No. 7,960,781.

FIELD OF THE INVENTION

This document relates generally to semiconductor devices, and more specifically to power semiconductor devices and methods of their manufacture.

BACKGROUND OF THE INVENTION

Metal-oxide semiconductor field effect transistors (MOSFETs) are a common type of power-switching device. A MOSFET device includes a source region, a drain region, a channel region extending between the source and drain regions, and a gate structure provided adjacent to the channel region. The gate structure includes a conductive gate electrode layer disposed adjacent to, but separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. While in the off state, the device must support a high voltage between the source region and the drain region.

Breakdown voltage (BVdss) and on-state resistance (Rdson) are two important device parameters for high voltage power-switching devices. For a specific application, a minimum breakdown voltage is required, and in practice, designers typically can meet a BVdss specification. However, this is often at the expense of Rdson. This trade-off in performance is a major design challenge for manufacturers and users of high voltage power-switching devices.

Recently, superjunction devices have gained in popularity to improve the trade-off between Rdson and BVdss. In a conventional n-channel superjunction device, multiple heavily doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices continue to look promising from a device performance standpoint, challenges still remain in perfecting robust device structures and methods of manufacture.

Accordingly, high voltage power-switching device structures and methods of manufacture are needed that provide lower Rdson, higher BVdss and more robust performance.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel devices, a person of ordinary skill in the art will appreciate that P-channel devices and complementary devices are also possible in accordance with the present invention. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

In addition, structures of the present description may embody either a cellular base design (where the body regions are a plurality of distinct and separate cellular regions) or a single base design (where the body region is a single region formed in an elongated pattern, typically in a serpentine pattern or a central portion with connected appendages). However, the device of the present description will be described as a cellular base design throughout the description for ease of understanding. It should be understood that it is intended that the present disclosure encompass both a cellular base design and a single base design.

DETAILED DESCRIPTION OF THE DRAWINGS

Figure 1:
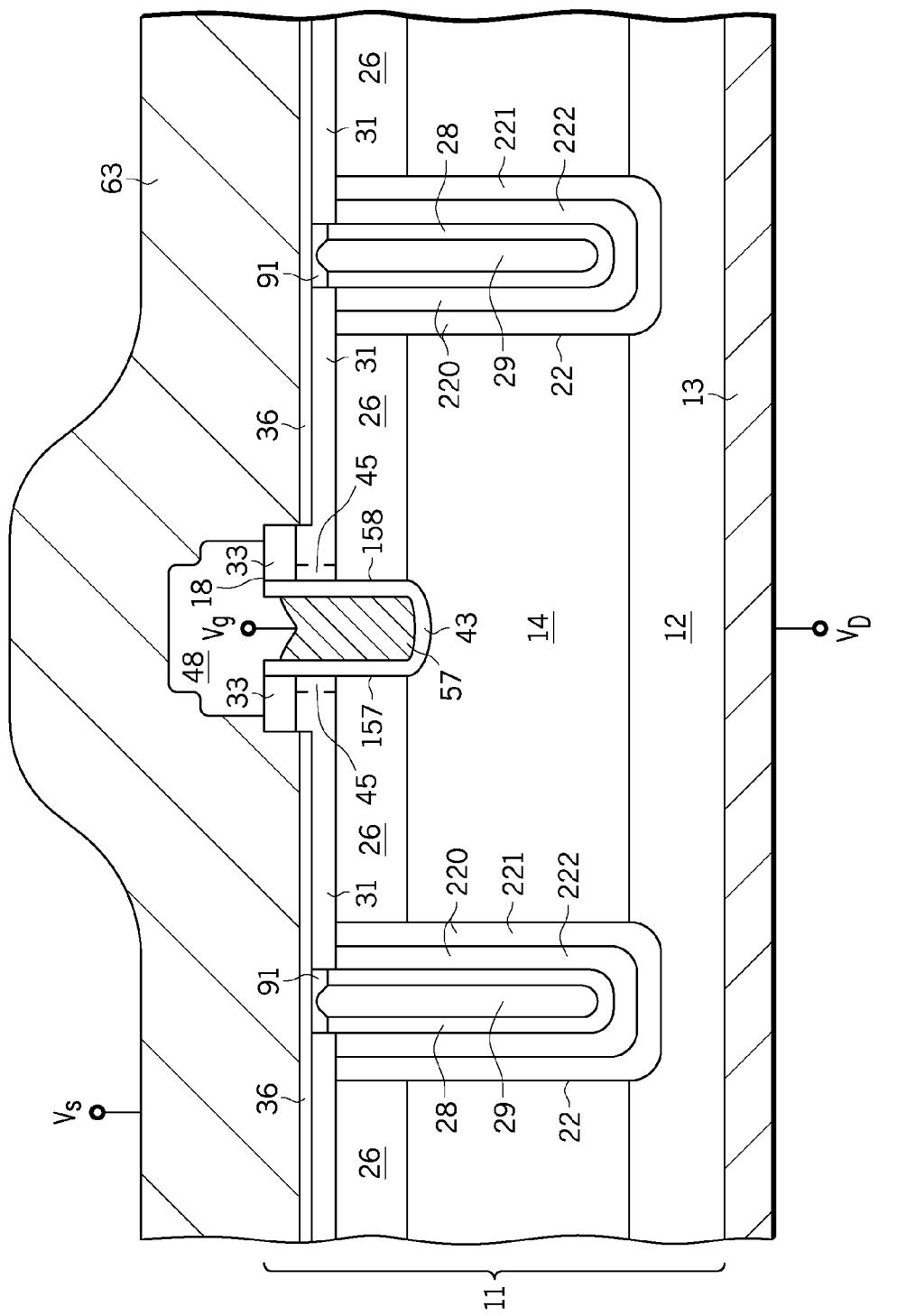
FIG. 1 illustrates an enlarged partial cross-sectional view of a semiconductor device in accordance with an embodiment of the present invention.

FIG. 1 shows a partial cross-sectional view of an insulated gate field effect transistor (IGFET), MOSFET, superjunction device, superjunction structure, charged-compensated, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in range of approximately 0.001 to about 0.01 ohm-cm, and may be doped with arsenic or phosphorous. In the embodiment shown, substrate 12 provides a drain region for device 10, which is adjacent to conductive layer 13. A semiconductor layer 14 is formed in or on substrate 12 and is n-type or p-type and doped light enough so as to not impact charge balance in the trench compensation regions described below. In one embodiment, layer 14 is formed using conventional epitaxial growth techniques. In an embodiment suitable for a 600 volt device, layer 14 is doped n-type or p-type with a dopant concentration of about $1.0 \times 10^{13}$ atoms/cm$^3$ to about $5.0 \times 10^{14}$ atoms/cm$^3$, and has a thickness on the order of about 40 microns to about 60 microns. Note that although semiconductor layer 14 is shown as being thicker than substrate 12 in the drawings, in reality substrate 12 may be thicker. It is shown this way for ease of understanding in the drawings.

In one embodiment, a portion of layer 14 is doped p-type in the active region portion of device 10, while another portion of layer 14 is doped n-type in the edge termination portion of the device. The thickness of layer 14 is increased or decreased depending on the desired BVdss rating of device 10. In an alternative embodiment, semiconductor layer 14 comprises a graded dopant profile with semiconductor layer 14 having a higher dopant concentration in proximity to substrate 12, and transitioning either gradually or abruptly to a lower concentration for the balance of its thickness towards major surface 18.

Other materials may be used for body of semiconductor material 11 or portions thereof including silicon-germanium, silicon-germanium-carbon, carbon-doped silicon, III-V materials, or the like. Additionally, those skilled in the art will understand that an insulated gate bipolar transistor (IGBT) device is achieved with the present structure by, for example, changing the conductivity type of substrate 12 to p-type (i.e., opposite to semiconductor layer 14).

Device 10 further includes spaced apart filled trenches, compensating trenches, semiconductor material filled trenches, charge-compensated trench regions, deep trench charge compensation regions, charge-compensated filled trenches, compensation trenches, localized vertical charge compensation structures, or localized charge compensation regions 22. As used herein, charge compensation generally means that the total charge of the opposite conductivity type layers is substantially or generally balanced or equal. Charge-compensated filled trenches 22 include a plurality of layers or multiple layers of semiconductor material 220, including at least two layers of opposite conductivity type (i.e., at least one each of n-type and p-type), which may be separated by an intrinsic, buffer, or lightly doped semiconductor layer or layers. As shown in FIG. 1, material 220 includes a layer 221 of n-type semiconductor material adjoining semiconductor layer 14 along sidewall surfaces of the trenches.

In accordance with a preferred embodiment, layers 221 are of the same conductivity type as source regions 33, and form a primary vertical low resistance current path from the channel to the drain when device 10 is in the on-state. A layer 222 of compensating p-type semiconductor material is formed overlying layer 221. By way of example, n-type layers 221 and p-type layers 222 have a dopant concentration on the order of about $1.0 \times 10^{15}$ to about $1.0 \times 10^{17}$ atoms/cm$^3$, and each has a thickness of about 0.1 microns to about 0.4 microns. When device 10 is an off state, p-type layers 222 and n-type layers 221 compensate each other to provide an increased BVdss characteristic. Although no buffer layers are shown in the device of FIG. 1, it is understood that they may be present in earlier steps in fabrication. In a preferred embodiment, layers of semiconductor material 220 comprise a single crystalline semiconductor material. Additional details regarding charge-compensated trenches 22 and layers of semiconductor material 220 are described below in conjunction with FIGS. 4 and 5.

In a preferred embodiment, device 10 includes a dielectric layer 28 formed overlying layers of semiconductor material 220. In one embodiment, dielectric layer 28 is a deposited silicon oxide layer having a thickness of about 0.2 microns. In the embodiment shown, charge-compensated trenches 22 are configured or formed with a void or sealed core 29 at a centrally located portion and are capped with a plug structure 91. In a preferred embodiment, plugs 91 comprise a single crystal semiconductor material, which is epitaxially grown along upper portions of layers of semiconductor material 220 to seal off charge-compensated trenches 22. In one embodiment, the single crystal semiconductor material is subsequently planarized so that upper surfaces of plugs 91 are in proximity to major surface 18. In an alternative embodiment, charge-compensated trenches 22 are voidless, and filled with materials such as dielectrics, polycrystalline semiconductor material, single crystal semiconductor material, or combinations thereof.

Although not shown, it is understood that during the formation of device 10, n-type dopant from highly doped substrate 12 diffuses into the lower portions of charge-compensated trenches 22 so that those portions of trenches 22 within substrate 12 become more heavily doped n-type.

Device 10 also includes a well, base, body or doped regions 31 formed in semiconductor layer 14 between and in proximity to, adjacent to, or adjoining charge-compensated trenches 22. Body regions 31 extend from major surface 18 of semiconductor material 11. In one embodiment, body regions 31 comprise p-type conductivity, and have a dopant concentration suitable for forming an inversion layer that operates as conduction channels 45 of device 10. Body regions 31 extend from major surface 18 to a depth of about 1.0 to about 5.0 microns. As stated above, body regions 31 comprise a plurality of individually diffused regions or comprise a connected, single or commonly diffused region of selected shape.

N-type source regions 33 are formed within, above, or in body regions 31 and extend from major surface 18 to a depth of about 0.2 microns to about 0.5 microns. In the embodiment shown, portions of major surface 18 extend down and then outward from the edges of source regions 33 so that contact is made to horizontal and vertical surfaces of source regions 33 by source contact layer 63. One or more p-type body contact regions 36 are formed in at least a portion of each body region 31. Body contact regions 36 are configured to provide a lower contact resistance to body region 31, and to lower the sheet resistance of body regions 31 under source regions 33, which suppresses parasitic bipolar effects.

In accordance with a preferred embodiment, body contact regions 36 and body regions 31 overlie charge-compensated trenches 22 as shown in FIG. 1, and together with source contact layer 63 are configured to provide ohmic contact to and continuity with p-type layers 222 in charge-compensated trenches 22. This ohmic contact structure is configured to provide a grounded structure for p-type layers 222, which eliminates lateral electric fields at major surface 18 and improves the breakdown voltage performance of device 10. This structure also grounds the effects of any defects present in proximity to major surface 18 and within or in proximity to charge-compensated trenches 22. The structure of device 10 greatly simplifies the ability to make contact to layers 222, which is necessary for optimum device performance. In particular, device 10 avoids using any complex topography overlying the upper portion of charge-compensated trenches 22, which simplifies the ohmic contact structure and method.

Device 10 further includes a trench gate or control structure 157 adjoining body regions 31 and source regions 33. Control structure 157 is laterally spaced apart from adjacent charge-compensated trenches 22. That is, control structure 157 does not overlie charge-compensated trenches 22. Trench gate structure 157 includes a gate trench 158 and a gate dielectric layer 43 formed overlying surfaces of gate trench 158. In one embodiment, gate dielectric layer 43 comprises a silicon oxide, and has a thickness of about 0.05 microns to about 0.1 microns. In another embodiment, gate dielectric layer 43 has a thickness at the lower surfaces of gate trench 158 that is greater or thicker than the thickness of gate dielectric layer 43 along the sidewalls of gate trench 158. In alternative embodiments, gate dielectric layer 43 comprises silicon nitride, tantalum pentoxide, titanium dioxide, barium strontium titanate, or combinations thereof including combinations with silicon oxide, or the like.

Trench gate structure 157 further includes a conductive gate region 57 formed within control or gate trench 158 and overlies gate dielectric layer 43. In one embodiment, a source region 33 is interposed between a conductive gate region 57 and a charge compensation trench 22. Conductive gate region 57 comprises, for example, n-type polysilicon. Although conductive gate region 57 is shown as recessed below major surface 18, conductive gate region 57 may extend higher or above major surface 18. Trench gate structure 157 is configured to control the formation of channels 45 and the conduction of current in device 10.

To facilitate a sub-surface current path, device 10 further includes n-type doped layers or sub-surface doped layers 26. Specifically, doped layers 26 are configured to provide a sub-surface conduction path between the drain end of channels 45 and n-type layers 221, which are the primary conduction layers or vertical conduction paths in charge compensation trenches 22. That is, in device 10 current flows vertically through channels 45, then horizontally through doped layers 26, and then vertically through layers 221. Doped layers 26 are configured so that current flow is isolated from major surface 18 by body regions 31 and body contact regions 36, which are opposite conductivity types (p-type) from doped layers 26 (n-type). This isolation feature keeps the conduction path away from defect regions near the surface thereby avoiding any conduction related problems. Moreover, the grounded p-type layer 222 structure further isolates the effects of any high defect density regions from the primary conduction path. In addition, by placing body regions 31 and body contact regions 36 so that they overlie doped regions 26, a preferred concave-shaped junction is provided, which surrounds n-type layers 221 and doped layer 26. This beneficially enhances BVdss.

Device 10 further includes an interlayer dielectric region 48 formed overlying major surface 18, which is patterned to provide openings to body contact regions 36 and source regions 33. A portion of interlayer dielectric region 48 is left overlying trench gate structure 57 to provide isolation for conductive gate region 57. Interlayer dielectric region 48 comprises for example, a silicon oxide such as a deposited oxide, and has a thickness from about 0.4 microns to about 1.0 microns.

Source contact layer 63 is formed overlying major surface 18 and makes contact to both source regions 33 and body contact regions 36. In one embodiment, source contact layer 63 comprises a titanium/titanium nitride barrier layer and an aluminum silicon alloy formed overlying the barrier layer, or the like. Drain contact layer 13 is formed overlying an opposing surface of semiconductor material 11, and comprises, for example, a solderable metal structure such as titanium-nickel-silver, chrome-nickel-gold, or the like.

In summary, the structure and method of device 10 places primary conduction layer 221 adjacent the sidewall surface of charge-compensated trenches 22. Device 10 uses a trench gate control structure 157, which places the drain end of channel 45 spaced apart, away, or sub-surface from major surface 18. Device 10 incorporates sub-surface doped layers 26 that electrically connect the sub-surface drain ends of channels 45 to primary conduction layers 221 in charge-compensated trenches 22. This approach moves the primary current path away from the surface of the device, which makes it much less susceptible to stress issues and defects thereby improving performance. In addition, because the primary current path of device 10 is configured this way, forming the ohmic contact structure between p-type compensating doped layers 222, body regions 31, body contact regions 36 and source contact layer 63 is simplified.

The operation of device 10 proceeds as follows. Assume that source terminal 63 is operating at a potential $V_S$ of zero volts, conductive gate regions 157 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert adjacent conductive gate regions 157 to form vertical channels 45, which electrically connect source regions 33 to doped regions 26. A device current $I_D$ flows from drain terminal 13 and is routed through n-type layers 221, doped layer 26, channels 45, source regions 33, to source terminal 63. Hence, current $I_D$ flows vertically through n-type layers 221 to produce a low on resistance, and horizontally through sub-surface doped layers 26 keeping the current path isolated from major surface 18. In one embodiment, $I_D$=1.0 amperes. To switch device 10 to the off state, a control voltage $V_G$ of less than the conduction threshold of the device is applied to conductive gate regions 157 (e.g., $V_G$<5.0 volts). This removes channels 45 and $I_D$ no longer flows through device 10. In the off state, n-type layers 221 and p-type layers 222 compensate each other as the depletion region from the primary blocking junction spreads, which enhances BVdss. Another advantage of device 10 is that the simplified ohmic contact structure between p-type compensating doped layers 222, body region 31, body contact region 36 and source contact layer 63 enhances switching characteristics. For example, when device 10 switches from an on state to an off state, the ohmic contact pulls both electrons and holes from the structure more efficiently.

Figure 2:
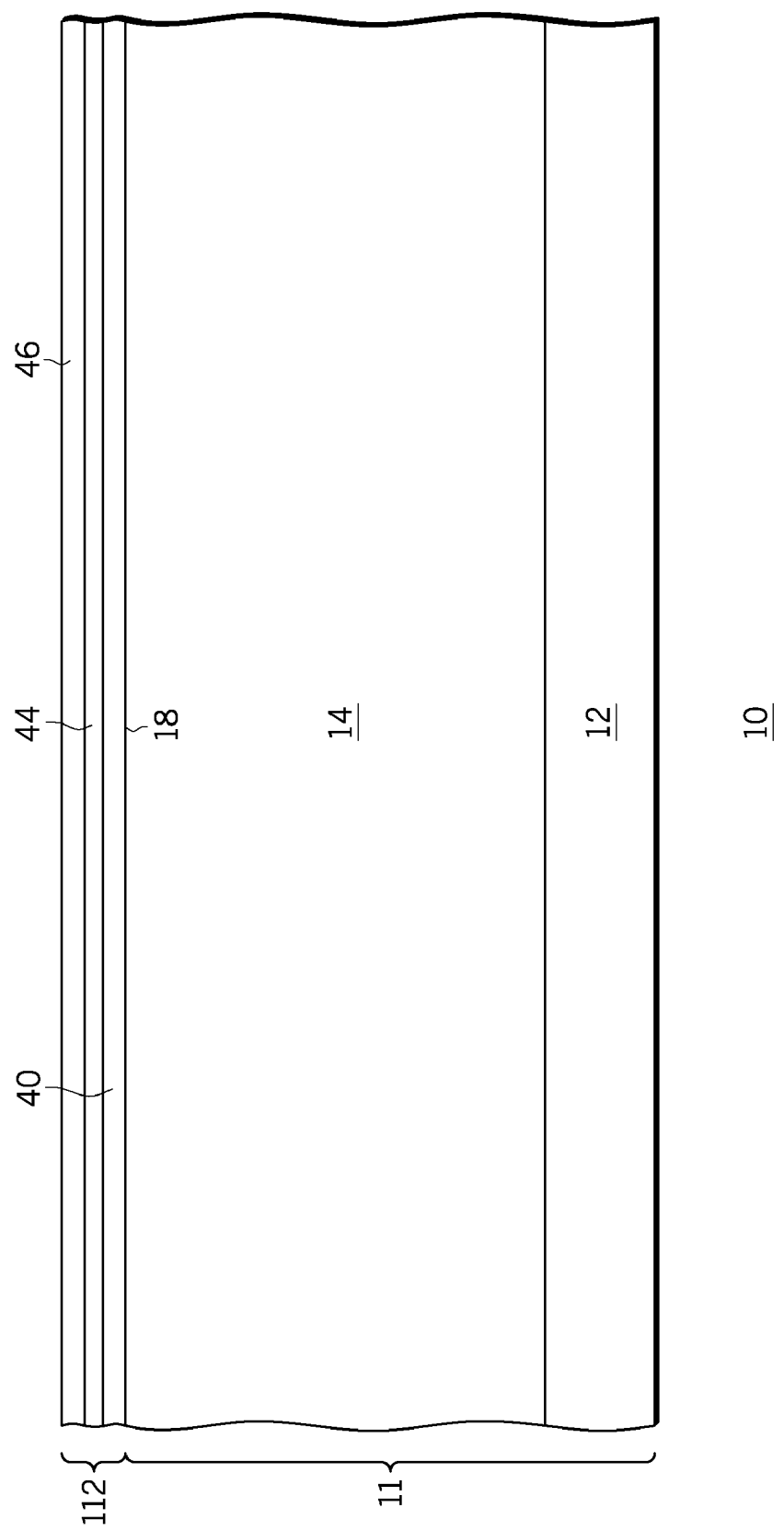
FIGS. 2-14 illustrate enlarged partial cross-sectional views of the semiconductor device of FIG. 1 at various stages of fabrication.

Turning now to FIGS. 2-14, a process for forming device 10 in accordance with a preferred embodiment is described. FIG. 2 shows an enlarged partial cross-sectional view of device 10 at an early stage of fabrication. An example of the material characteristics of body of semiconductor material 11 was provided in conjunction with FIG. 1 above. In an early step, a dielectric layer 40 is formed overlying major surface 18, and comprises for example, a thermal oxide about 0.2 microns thick. A dielectric layer 44 comprising a different material than dielectric layer 40 is then formed overlying dielectric layer 40. By way of example, dielectric layer 44 is a silicon nitride when first dielectric layer 40 is a silicon oxide. In one embodiment, dielectric layer 44 is approximately 0.2 microns of silicon nitride, and is formed using conventional deposition techniques. Next, a dielectric layer 46 is formed overlying dielectric layer 44 and comprises approximately 0.6 microns of deposited silicon dioxide. These layers provide an example of a hard mask structure 112 for subsequent processing.

Figure 3:
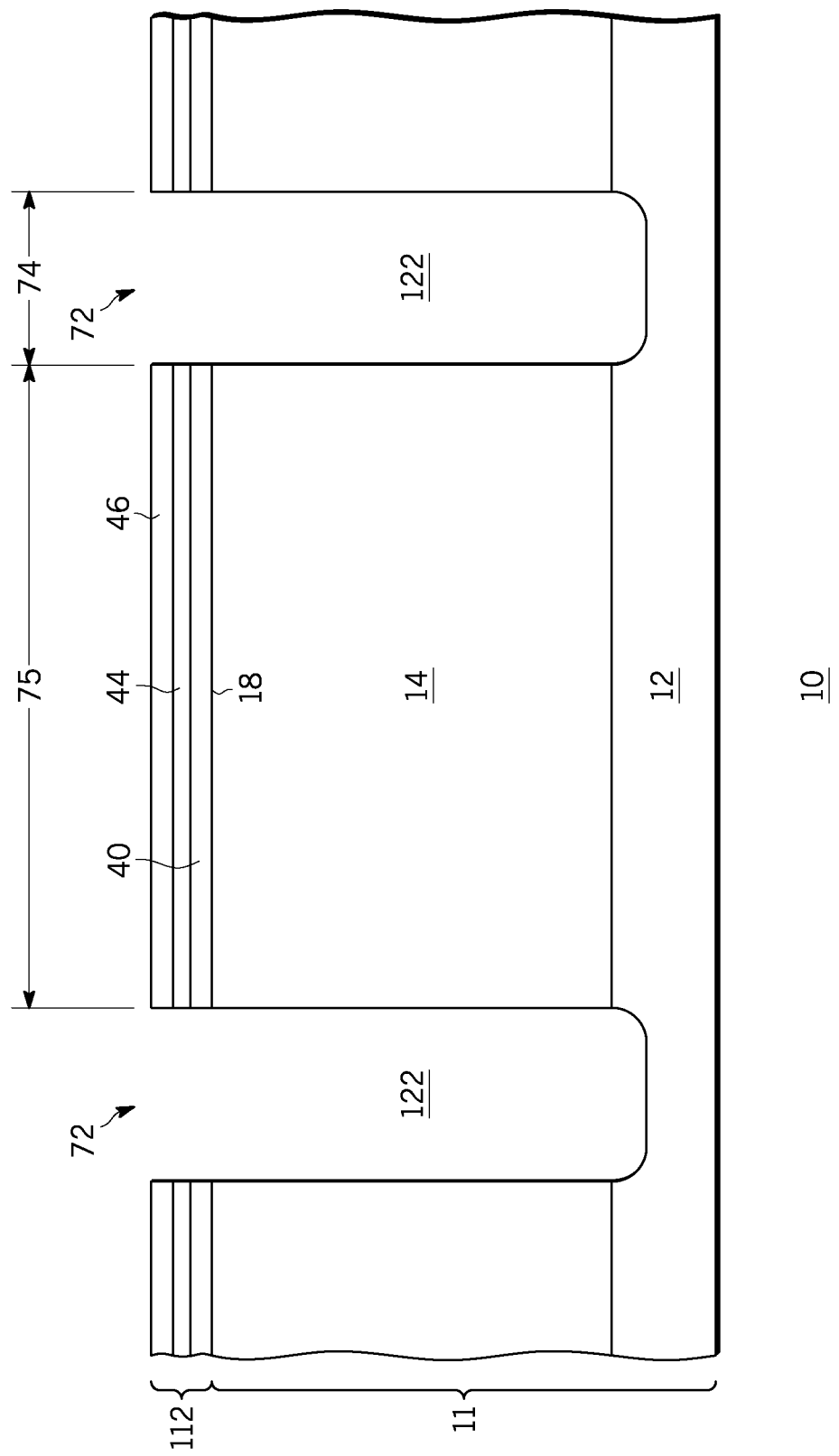

FIG. 3 shows an enlarged partial cross-sectional view of device 10 at a subsequent stage of fabrication. Hard mask structure 112 is patterned using conventional photolithographic and material removal techniques to form openings 72, which expose portions of major surface 18. By way of example, openings 72 have a width 74 of about 3.0 microns to about 4.0 microns. Next, trenches 122 are formed through openings 72 extending from major surface 18 into semiconductor layer 14. In one embodiment, semiconductor layer 14 has a width 75 between adjacent trenches 122 of about 2.0 microns to 3.0 microns. To ease the understanding of this embodiment, width 75 is shown greater than width 74 with the understanding that width 75 may be less than or equal width 74. In one embodiment, trenches 122 extend into at least a portion of substrate 12. The depth of trenches 122 is determined by the thickness of semiconductor layer 14, which is a function of BVdss.

In one embodiment, Deep Reactive Ion Etching (DRIE) etching with a fluorine or chlorine based chemistry is used to form trenches 122. Several techniques are available for DRIE etching trenches 122 including cryogenic, high-density plasma, or Bosch DRIE processing. In one embodiment, trenches 122 have substantially vertical sidewalls. In an alternative embodiment, trenches 122 have a tapered profile where the width of the trench at the trench lower surface is less than width 74. Although trenches 122 are stated as plural, it is understood that trenches 122 may be a single continuous trench or connected trench matrix. Alternatively, trenches 122 may be a plurality of individual trenches with closed ends and separated by portions of body of semiconductor material 11. The depth of trenches 122 is in a range from about 3.0 microns to about 100 microns.

Figure 4:
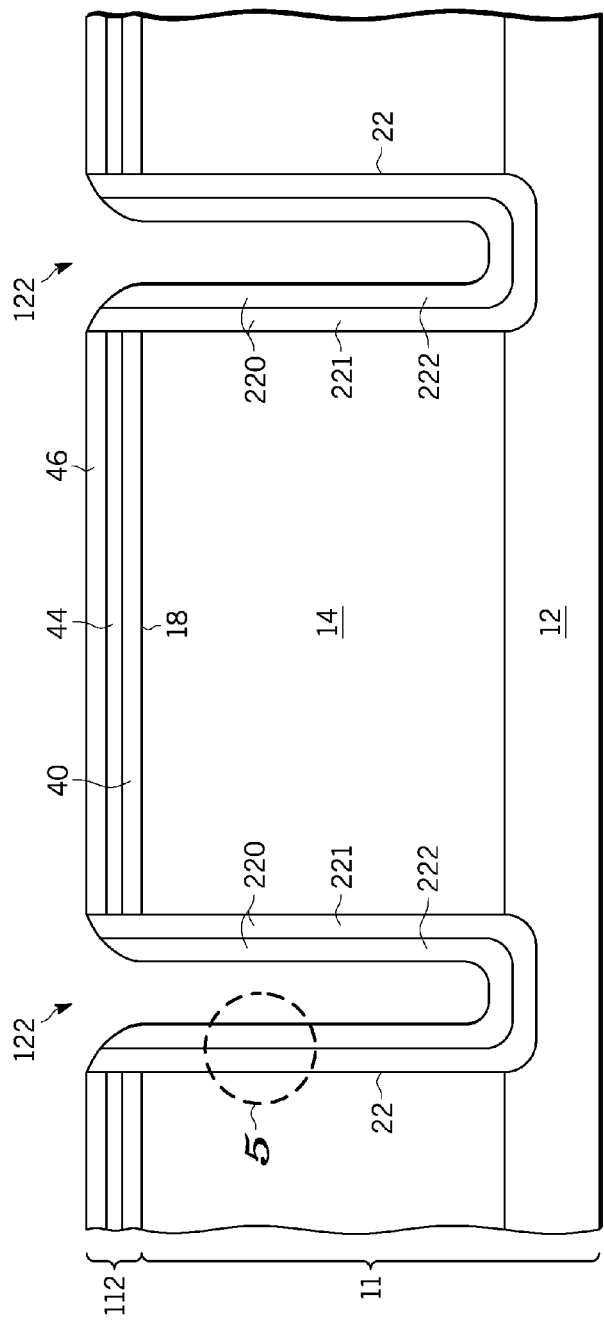

FIG. 4 shows an enlarged partial cross-sectional view of device 10 at a later stage of fabrication. At this point, layers of semiconductor material 220 are formed, grown, or deposited in trenches 122 as a first step in forming charge-compensated trenches 22. In one embodiment, single crystal semiconductor epitaxial growth techniques are used to form layers of semiconductor material 220.

In a first step, a thin oxide such as a thermal oxide (not shown) is formed on the sidewalls of trenches 122 to remove any surface damage caused by the material removal step. The thin oxide is then removed using conventional isotropic etching techniques (e.g., 10:1 wet oxide strip). Next, semiconductor material 11 is placed into an epitaxial growth reactor and pre-cleaned as a first step in the epitaxial growth process. When silicon is the selected semiconductor material for forming layers of semiconductor material 220, silicon source gases such as trichlorosilane ($SiHCl_3$), dichlorosilane ($SiH_2Cl_2$), silane ($SiH_4$) or disilane ($Si_2H_6$) are suitable for forming these layers.

Figure 5:
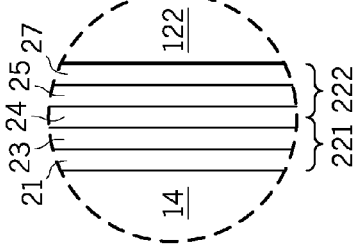

With reference now to FIG. 5, which is a partial cross-sectional view of a portion 5 of trench 122 in FIG. 4, the formation of a preferred embodiment of layers of semiconductor material 220 is described. In a preferred embodiment, all layers that make up layers of semiconductor material 220 are grown in continuous manner inside the epitaxial reactor. Further, it was found that using a reduced pressure epitaxial reactor is preferred when forming layers of semiconductor material 220. Specifically, it is preferred that the epitaxial growth conditions are set to provide a mean free path roughly equal to or greater than the depth of trenches 122. It is also preferred that the aspect ratio of trenches 122 be in a range from about 1:1 to about 30:1 to provide good quality epitaxial layers.

It is further preferred that a selective epitaxial growth process is used to avoid growing epitaxial silicon overlying dielectric layer 46, which would produce polycrystalline silicon. Selectivity is controlled by adding HCl gas to the epitaxial growth chamber in an amount sufficient to suppress growth of silicon on the dielectric layers. Preferably, when using dichlorosilane or silane as the silicon source gas, the HCl flow rate is set to be in a range from greater than zero to about four to five times the flow rate of the silicon source gas. In an alternative embodiment, blanket layers are grown (i.e., the layers are grown overlying major surface 18 in addition to trenches 122), and planarization techniques are used to remove portions of the blanket layers that overlie major surface 18.

In the embodiment shown, an intrinsic layer 21 is formed first along the surfaces of trenches 122, and has a thickness of about 0.05 to about 0.1 microns. Intrinsic layer 21 preferably is undoped, and functions, among other things, to smooth out any irregularities on the sidewall and lower surfaces of trenches 122. N-type layer 23 is then formed overlying layer 21, with a phosphorous, arsenic or antimony dopant source being suitable. In one embodiment, n-type layer 23 is lightly doped and has a dopant concentration on the order of about $1.0 \times 10^{15}$ to about $1.0 \times 10^{17}$ atoms/cm$^3$. N-type layer 23 has a thickness typically less than about 1.0 microns, with a thickness of about 0.1 microns to about 0.4 microns being one preferred range.

Next, an intrinsic layer 24 is formed overlying n-type layer 23, and has thickness of about 0.1 to about 0.4 microns. Preferably, intrinsic layer 24 is undoped. A p-type layer 25 is then formed overlying second intrinsic layer 24, with boron being a suitable dopant source. By way of example, p-type layer 25 has a dopant concentration on the order of about $1.0 \times 10^{15}$ to about $1.0 \times 10^{17}$ atoms/cm$^3$. P-type layer 25 has a thickness typically less than about 1.0 microns, with a thickness of about 0.1 microns to about 0.3 microns being one preferred range. One purpose of intrinsic layer 24 is to improve conduction by reducing the mutual depletion of layers 23 and 25 at low drain voltage, which provides higher conduction efficiency.

Next, an intrinsic layer 27 is formed overlying p-type layer 25, and has a thickness of about 0.1 to about 1.0 microns. During subsequent heat treatments, n-type dopant in n-type layer 23 diffuses into intrinsic layers 21 and 24 to form n-type layer 221 as shown in FIGS. 1 and 4, and p-type layer 25 diffuses into intrinsic layers 24 and 27 to form p-type layer 222 as shown in FIGS. 1 and 4. The multiple layers shown in FIG. 5 are not shown in the other figures for ease of understanding. The dopant concentrations and thicknesses of n-type layers 221 and p-type layers 222 are configured to provide an appropriately balanced charge when device 10 is in operation. In a preferred embodiment, the center or central portion of trenches 122 is left open (i.e., that portion is not completely filled with a solid material). Additionally, in a preferred embodiment, after the formation of layers of semiconductor material 220, the epitaxial reactor is purged of HCl, source, and dopant gases, and device 100 is exposed to hydrogen at an elevated temperature. This smoothes out the topography of the outer surfaces of layers of semiconductor materials 220, which, among other things, enhances subsequent processing including the formation of plugs 91.

Figure 6:
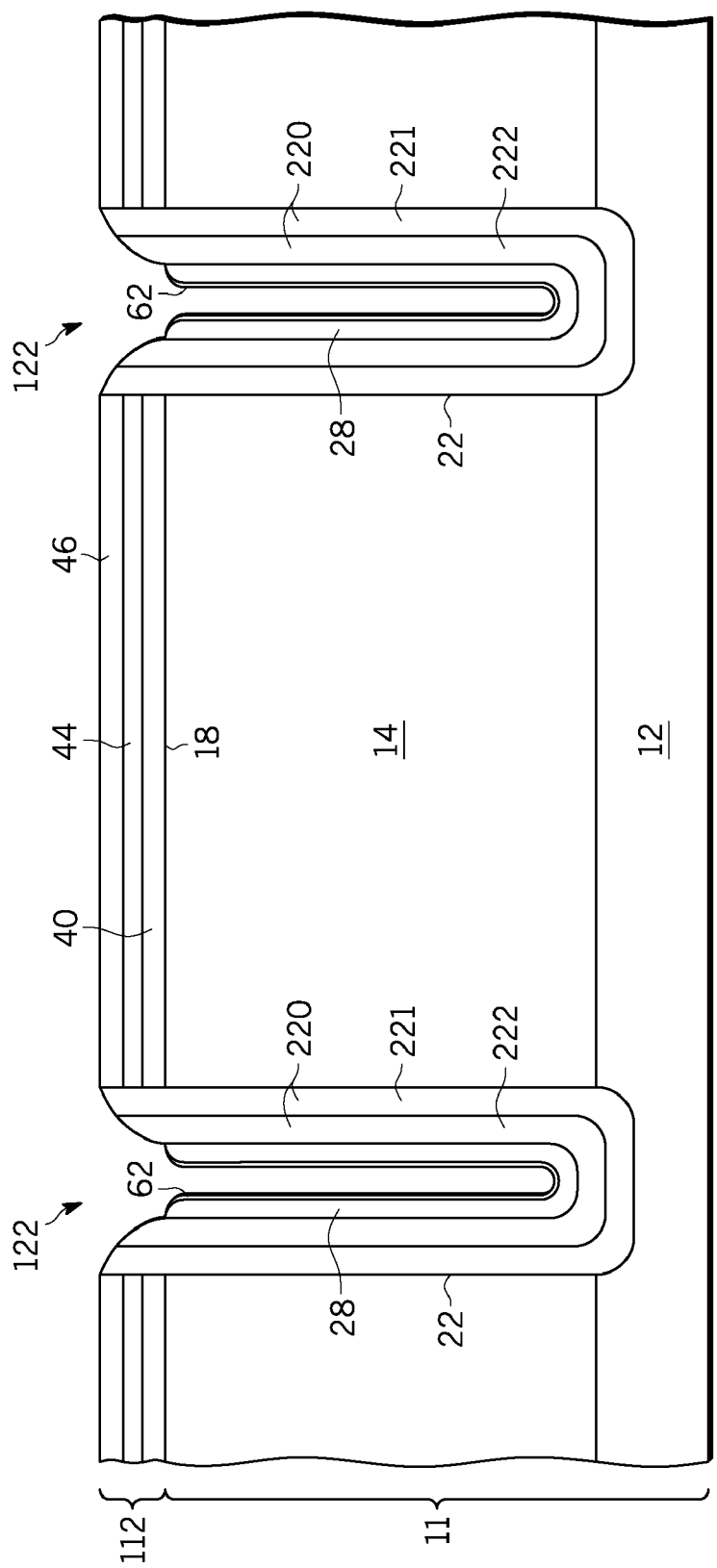

FIG. 6 shows an enlarged partial cross-sectional view of device 10 at a still further stage of fabrication. A first dielectric layer is formed overlying major surface 18 and layers of semiconductor material 220 in trenches 122. By way of example, this first dielectric layer comprises an oxide. In one embodiment, 0.02 microns of dry oxide are formed, followed by about 0.2 microns of deposited oxide. Next, a second dielectric layer is formed overlying the first dielectric layer. In one embodiment, the second dielectric layer comprises about 0.1 microns of silicon nitride. Conventional deposition techniques are used to form the first and second dielectric layers. Conventional dry etching techniques are then used to etch back the first and second dielectric layers leaving dielectric spacers, spacer layers, or dielectric layers 28 and 62 of each material within trenches 122 as shown in FIG. 6. In the example described, layer 28 comprises about 0.02 microns of dry oxide and about 0.2 microns of deposited oxide and layer 62 comprises about 0.1 microns of silicon nitride.

Figure 7:
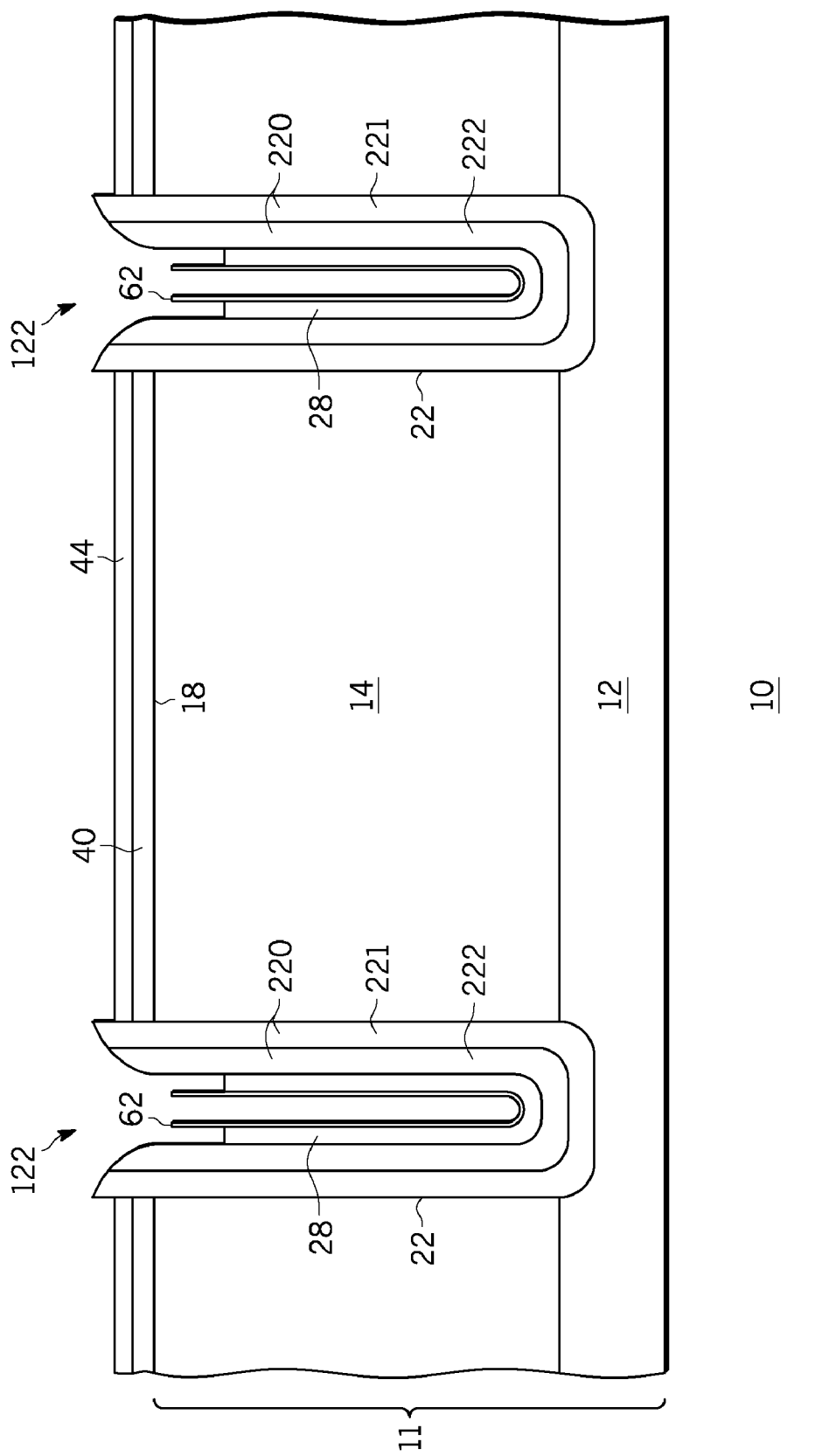
Figure 8:
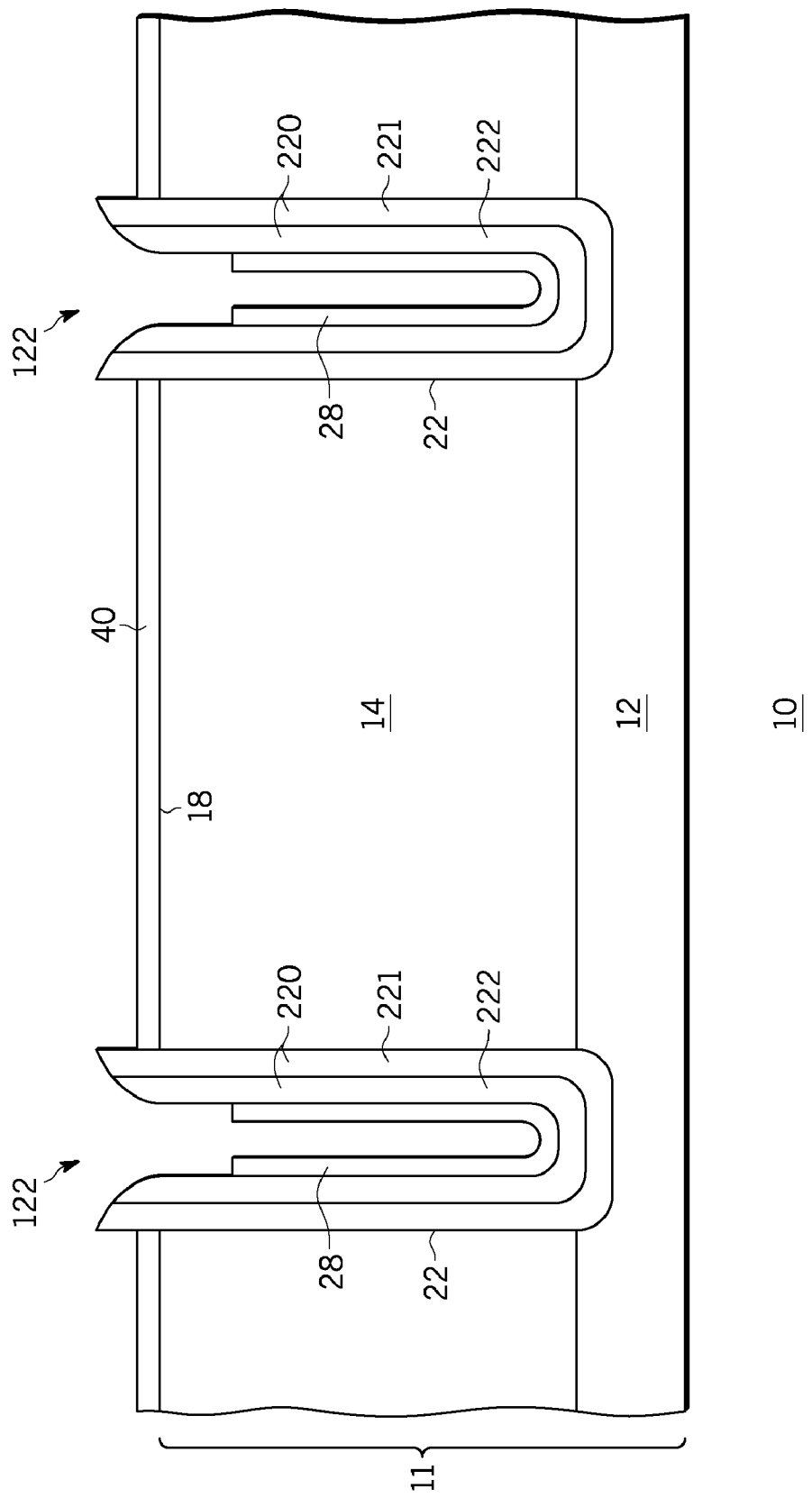

Next as shown in FIG. 7, which is an enlarged partial cross-sectional view of device 10 after further processing, dielectric layer 28 is exposed to an additional selective etching step to remove an upper portion of the dielectric material so that dielectric layer 28 is recessed from upper surfaces of dielectric layer 62. By way of example, when dielectric layer 28 comprises an oxide, a diluted HF wet etch (e.g., 10:1 for about 8-11 minutes) is used to recess dielectric layer 28 approximately 1.2 microns below dielectric layer 62. During these steps, dielectric layer 46 also may be removed. Dielectric layers 62 and 44 are then removed using conventional material removal techniques as shown in FIG. 8.

Figure 9:
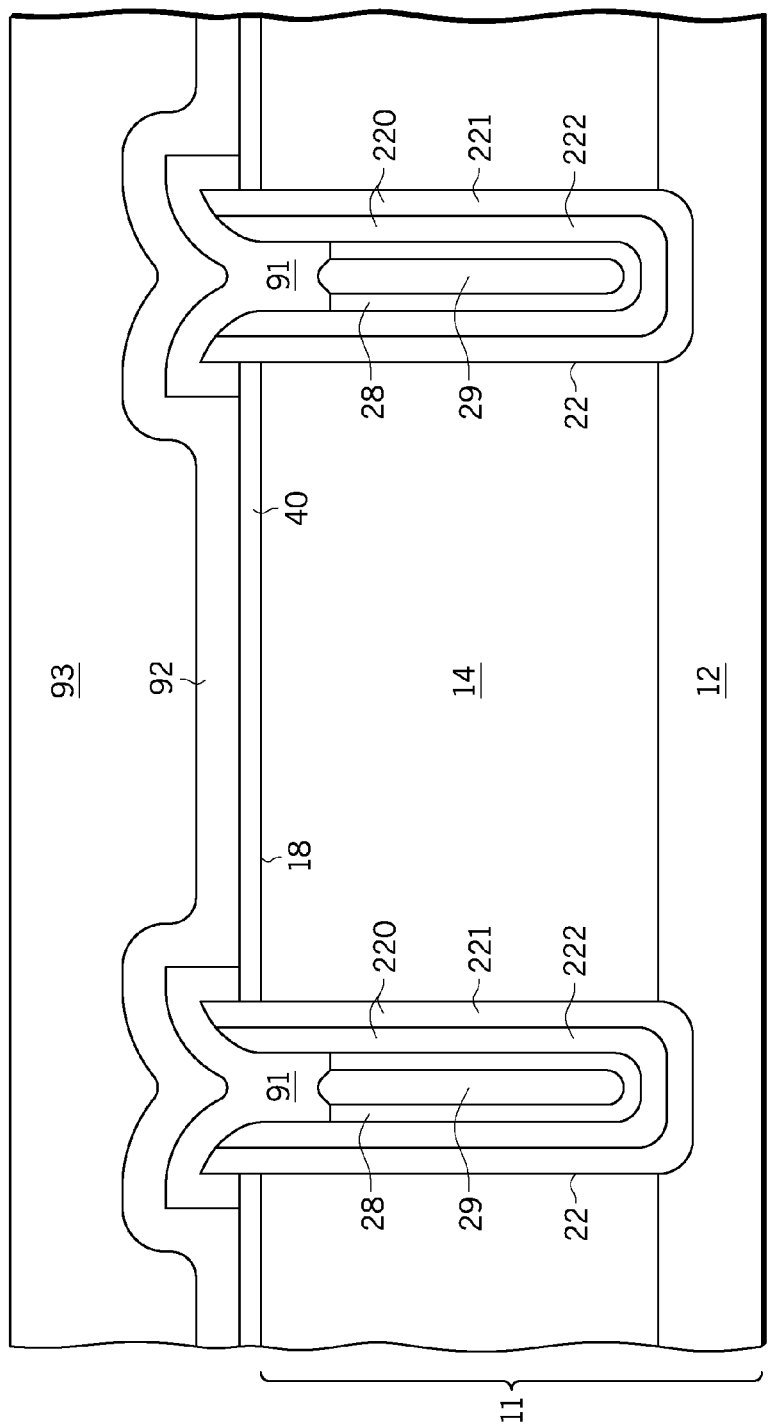

FIG. 9 shows an enlarged partial cross-sectional view of device 10 after additional processing. In accordance with a preferred embodiment, an epitaxial plug, single crystalline plug, plug of semiconductor material, or semiconductor plug region 91 is formed within the remaining openings of trenches 122 above dielectric layers 28 and along exposed portions of layers of semiconductor material 220. In accordance with this embodiment, plugs 91 comprise an epitaxial semiconductor material that has an opposite conductivity type to semiconductor layer 14. In the embodiment shown, plugs 91 are p-type. In one embodiment, plugs 91 have a dopant concentration between about $1.0 \times 10^{17}$ atoms/cm$^3$ and about $1.0 \times 10^{19}$ atoms/cm$^3$. In an alternative embodiment, plugs 91 are undoped. Preferably, reduced pressure and selective epitaxial growth techniques are used to form plugs 91.

In one embodiment for forming plugs 91, a dichlorosilane source gas is used with hydrogen and HCl, which makes the growth selective to the upper portions of trenches 122 only. In alternative embodiments, silane, disilane, or trichlorosilane source gases are used. Depending on the growth temperature selected, reactor pressure is set within a range from approximately ten Torr to atmospheric. In one embodiment, a single wafer reactor is used with a reactor pressure of about 20 Torr. Suitable growth temperatures for dichlorosilane are in a range from about 950 degrees Celsius to about 1050 degrees Celsius. Suitable growth temperatures for silane or disilane are in range from about 575 degrees Celsius to about 700 degrees Celsius. Suitable growth temperatures for trichlorosilane are in a range from about 1050 degrees Celsius to about 1175 degrees Celsius. Caution is required with higher growth temperatures to avoid unwanted intermixing of dopants within the various epitaxial layers or doped regions of device 10. In one embodiment, plugs 91 have thicknesses in the range of about 0.10 microns to about 0.60 microns. By way of example, thickness is adjusted depending on the desired structure of plugs 91 (e.g., near-closure, complete closure, or overgrowth).

In one embodiment, a growth rate of about 0.30 microns per minute is used when selective epitaxial growth and dichlorosilane are used. When a non-selective technique and dichlorosilane are used, a growth rate in a range of about 1.0 micron per minute to about 2.0 microns per minute is used. Gas flow rates depend on reactor configuration, and are set by the growth conditions and structure required. In one embodiment, the following gas flows ranges were used in a selective growth process to form plugs 91 in a closed configuration using dichlorosilane: 30-40 standard liters per minute (slm) of hydrogen, 0.70-0.80 slm HCl, and 0.20-0.25 slm dichlorosilane.

In accordance with a preferred embodiment, plugs 91 are configured to seal off voids 29 in trenches 122, and are further configured to do so with minimal defects and negligible stress compared to structures that use dielectric/polysilicon or polysilicon fill techniques. By suppressing defects and stress, the reliability and quality of device 10 is improved. In one embodiment, sealed cores 29 are under a vacuum of about 20 Torr with some hydrogen present in sealed cores 29 from the epitaxial growth process.

After plugs 91 are formed, a polycrystalline semiconductor layer 92 is formed overlying major surface 18. By way of example, layer 92 comprises a polysilicon layer about 0.6 microns to about 0.9 microns thick and is formed using conventional deposition techniques. A planarizing photo resist layer 93 on the order of 1.0 to 2.0 microns is then formed overlying polycrystalline semiconductor layer 92.

Figure 10:
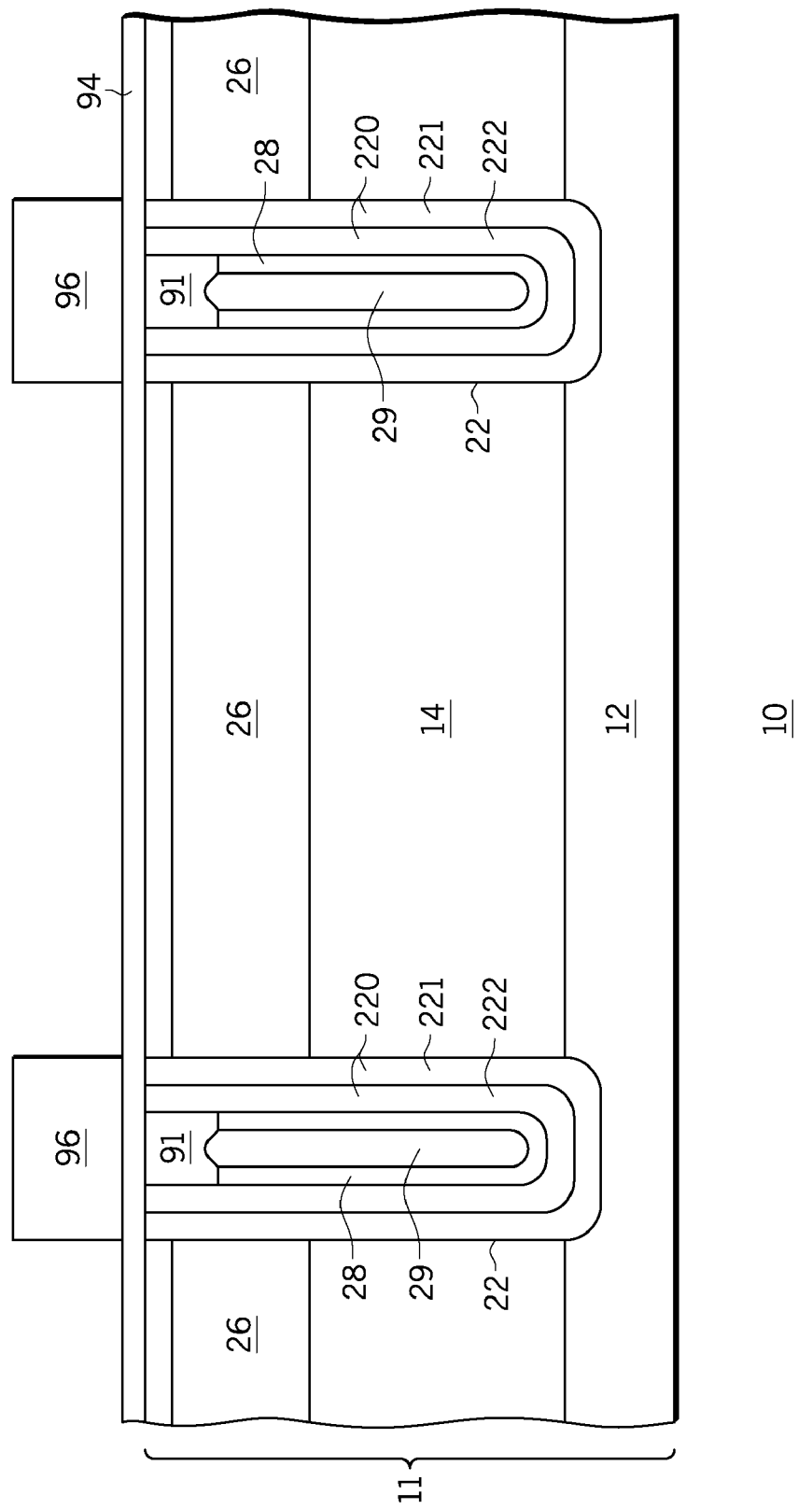

FIG. 10 is an enlarged partial cross-sectional view of device 10 after a planarizing or bulk removal process is used to remove layer 93, layer 92, and exposed or upper portions of plugs 91. By way of example, conventional etch back techniques are used for this removal step. In the alternative, chemical mechanical planarization techniques are used. Layer 40 is then removed using, for example, a wet chemical etch. Next, a dielectric layer 94 is formed overlying major surface 18 and comprises, for example, an implant oxide having a thickness of about 0.05 microns to about 0.09 microns. A patterned photoresist layer 96 is then formed overlying major surface 18 in preparation for forming doped layers 26.

In accordance with a preferred embodiment, dopant for doped layers 26 is then introduced or provided into semiconductor layer 14 below major surface 18 using patterned photoresist layer 96 as a mask. In one embodiment, high energy ion implantation is used to implant dopant for doped layers 26. By way of example, a MeV range implant of phosphorous is used, and an implant dose of about $1.0 \times 10^{12}$ atoms/cm$^2$ is sufficient. In this embodiment, the dopant concentration of layer 26 is greater than the dopant concentration of semiconductor layer 14 to provide a path having reduced resistance between channels 45 (shown in FIG. 1) and n-type layers 221. In a preferred embodiment, the high energy implant places doped layer 26 below major surface 18 as shown in FIG. 10 so that doped layer 26 is sub-surface. Patterned photoresist layer 96 is then removed. The implanted dopant is then heat treated to diffuse the n-type dopant into semiconductor layer 14 to a selected depth. By way of example, doped layer 26 extends to a depth of about 2.0 microns to about 3.0 microns. In accordance with a preferred embodiment, in the final structure doped layer 26 has a greater depth than body region 31. In an alternative embodiment, a combined heat treatment step is used after dopant for body regions 31 is introduced as described below. In an alternative embodiment, doped layers 26 are formed prior to the formation of trenches 122. By way of example, doped layers 26 are formed prior to the formation of hard mask 112 shown in FIG. 2.

Figure 11:
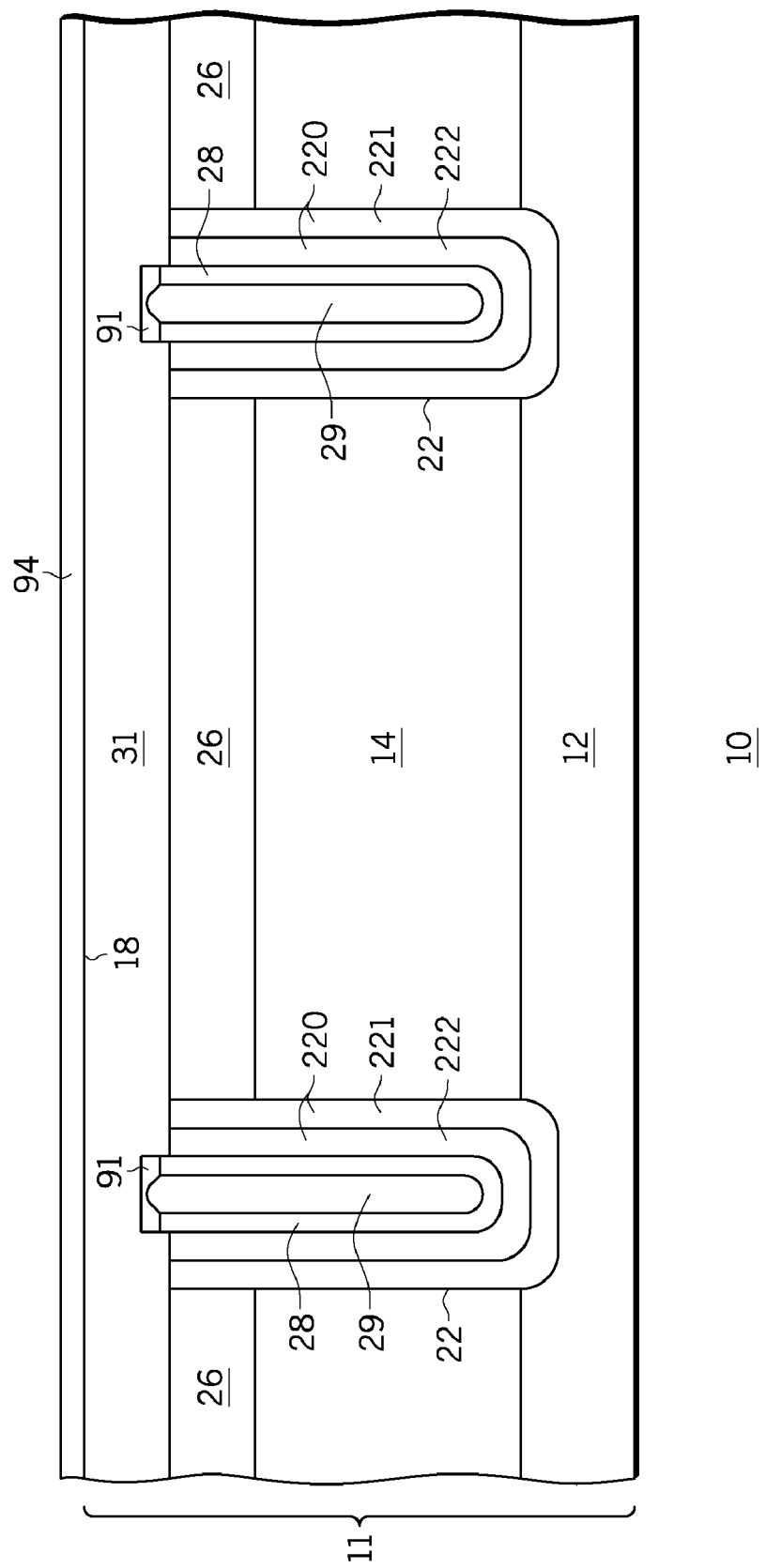

FIG. 11 shows an enlarged partial cross-sectional view of device 10 at a later step of fabrication. P-type dopant for body regions 31 is introduced or provided at major surface 18. In accordance with a preferred embodiment, body regions 31 extend laterally to overlie all or portions of charge-compensated trenches 22. That is, body regions 31 overlap at least p-type layers 222. By way of example, ion implantation is used with a boron implant dose of about $1.0 \times 10^{13}$ atoms/cm$^2$ and an implant energy of about 160 KeV. In an alternative embodiment, a series of boron implants is used to form body region 31, with a lighter dose/higher energy implant occurring first followed by gradually increasing doses and gradually decreasing energy implants occurring thereafter. In a further embodiment, this order is reversed. The implanted p-type dopant is heat treated to diffuse and/or activate the dopant to form regions 31. By way of example, body regions 31 have a depth of about 1.0 to about 2.0 microns.

Figure 12:
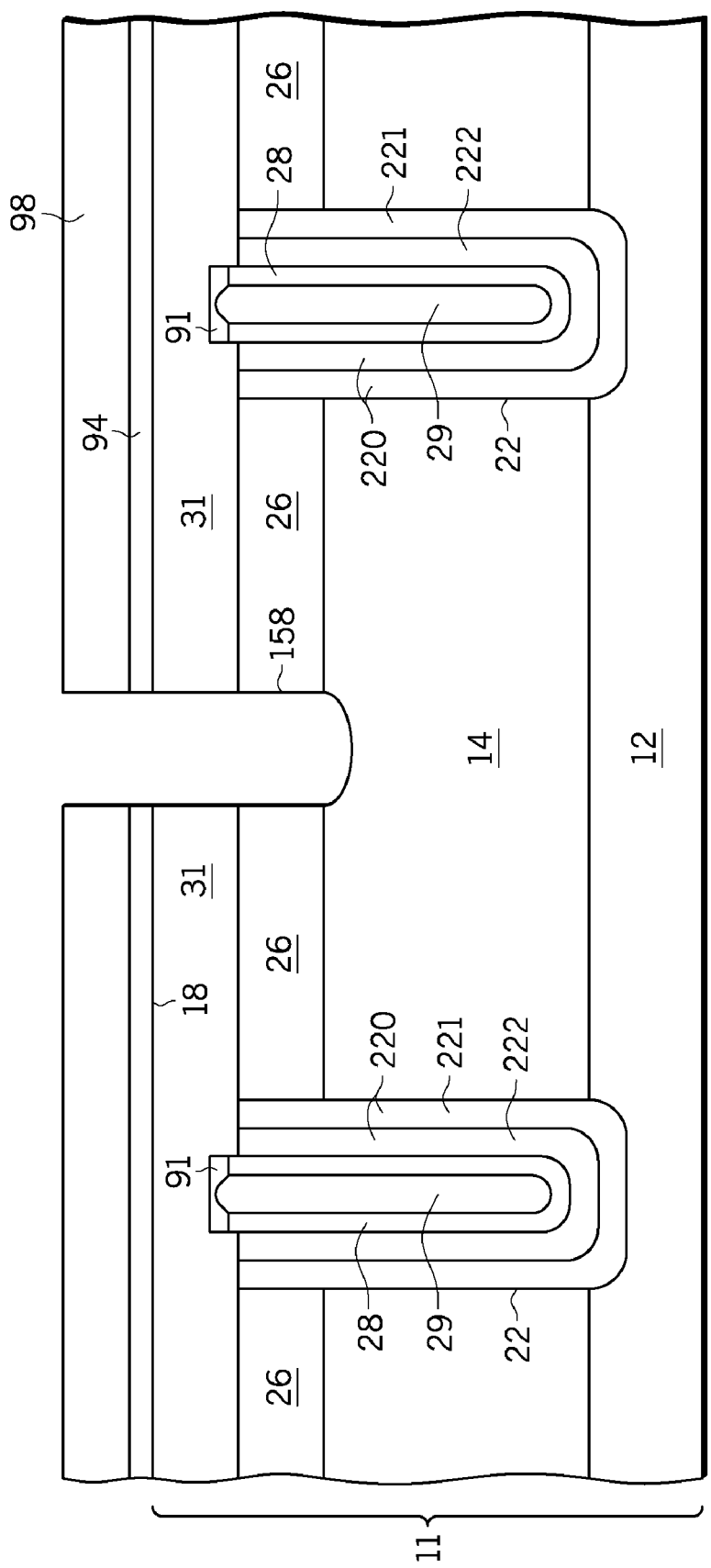

FIG. 12 is an enlarged partial cross-sectional view of device 10 after completing preliminary steps in the formation of a control or gate trench 158. In an early step, a dielectric layer 98 is formed overlying dielectric layer 94. By way of example, dielectric layer 98 comprises a silicon nitride layer about 0.1 microns to about 0.2 microns thick and is formed using conventional techniques. Next a layer of photoresist (not shown) is deposited overlying dielectric layer 98 and an opening is formed for control trench 158. Portions of layers 98 and 94 are then removed to expose a portion of major surface 18. The photoresist layer is then removed. Next, control trench 158 is formed extending from major surface 18 generally centrally located between adjacent charge-compensated trenches 22. By way of example, a conventional anisotropic dry etch is used to form control trench 158. By way of example, control trench 158 has a width of about 0.4 microns to about 0.7 microns and has a depth greater than the depth of body regions 31. In a preferred embodiment, control trench 158 has a depth greater than doped regions 26. In one embodiment, control trench 158 has a depth of about 2.2 microns to about 3.2 microns.

Figure 13:
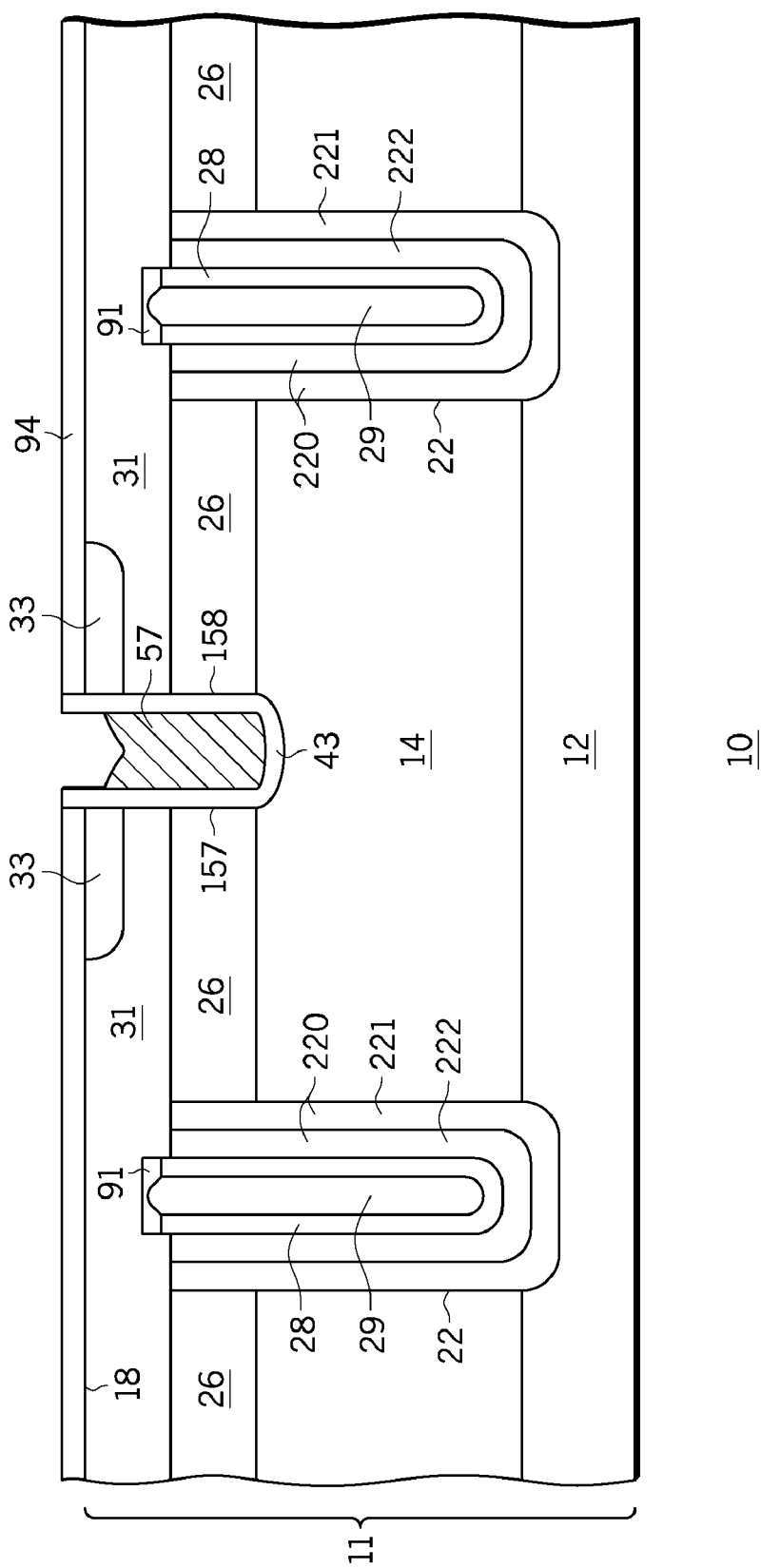

FIG. 13 is an enlarged partial cross-sectional view of device 10 after further processing. In one embodiment, a thin thermal oxide is grown overlying the exposed surfaces of control trench 158. This oxide is then removed. Dielectric layer 98 also is removed. Next, gate dielectric layer 43 is formed overlying surfaces of control trench 158. In one embodiment, gate dielectric layer 43 comprises silicon oxide and has a thickness of about 0.05 microns to about 0.1 microns. In another embodiment, gate dielectric layer 43 is thicker along the bottom portion and lower sidewall portions of control trench 158. A conductive layer such as a doped or undoped polysilicon layer is then deposited overlying gate dielectric layer 43 and partially removed to form gate conductive region 57. For example, gate conductive regions 57 comprise about 0.2 microns of doped or undoped polysilicon. If gate conductive region 57 is initially undoped, this region is subsequently doped during the formation of source regions 33. In one embodiment, gate conductive region 57 is recessed below major surface 18. Together, control trench 158, gate dielectric layer 43 and gate conductive region 57 form control structure 157. In an alternative embodiment, control structure 157 is formed prior to the formation of charge-compensated trenches 22. This alternative approach is used when the impact of the thermal budget on the dopant profiles of layers 221 and 222 is a concern. The configuration of doped regions 26 is conveniently flexible enough to support either process sequence.

Next, a photoresist layer (not shown) is deposited and patterned to provide openings for the formation of source regions 33 adjacent to control structure 157. Source regions 33 are then formed using, for example, a phosphorous or arsenic ion implant and anneal step. By way of example, an arsenic implant is used with a dose of $1.0 \times 10^{15}$ atoms/cm$^2$ to about $5.0 \times 10^{15}$ atoms/cm$^2$ being sufficient. This dopant is activated using, for example, a rapid anneal of 45 seconds at 1030 degrees Celsius. In this embodiment, source regions 33 are formed on both sides of control structure 157.

Figure 14:
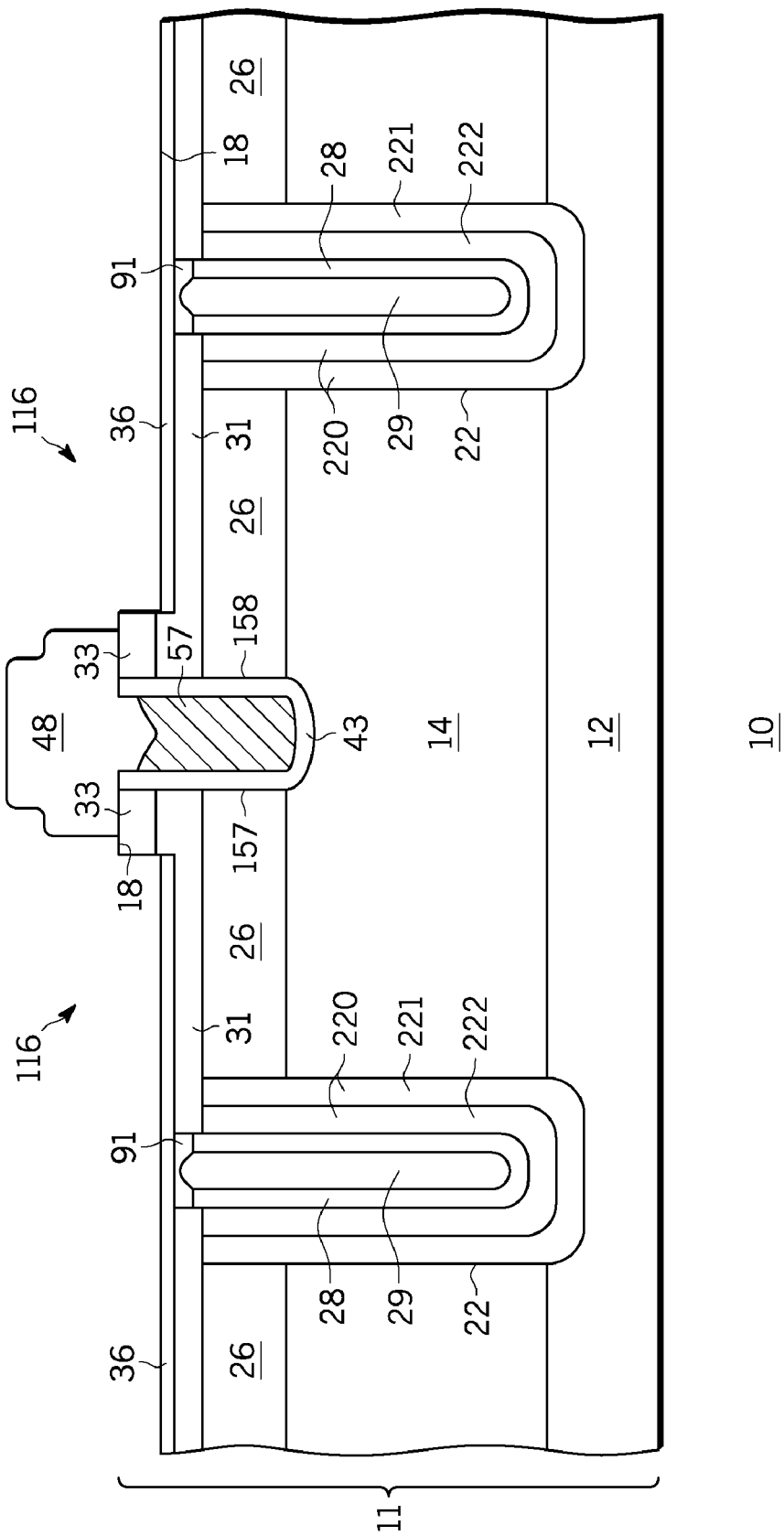

Next, interlayer dielectric region 48 is formed overlying major surface 18. By way of example, interlayer dielectric 48 comprises a deposited oxide and has a thickness on the order of about 1.0 micron. A conventional contact photoresist and etch process is then used to form contact openings 116 overlying and exposing portions of major surface 18 as shown in FIG. 14. In a preferred embodiment, an anisotropic etch is then used to remove a portion of semiconductor layer 14 adjacent source regions 33 and above body regions 31 and compensation trenches 22. By way of example, enough material from semiconductor layer 14 is removed to extend to about the depth of source regions 33 or deeper. An additional dopant is then added to portions of major surface 18 above body regions 31 and compensation trenches 22 to form body contact regions 36. By way of example, a boron ion implant is used with an implant dose on the order of $1.0 \times 10^{15}$ atoms/cm$^2$ to about $5.0 \times 10^{15}$ atoms/cm$^2$ being sufficient. The implanted dopant is then activated using, for example, a rapid anneal process. Portions of interlayer dielectric layer 48 are then removed along the sides to expose upper surface portions of source regions 33 (shown in FIG. 1). Source contact layer 63 is then formed overlying major surface 18 and makes contact to both source regions 33 and body regions 36 as shown in FIG. 1. In one embodiment, source contact layer 63 comprises a titanium/titanium nitride barrier layer and an aluminum silicon alloy formed overlying the barrier layer, or the like. Drain contact layer 13 is formed overlying an opposing surface of semiconductor material 11 as shown in FIG. 1, and comprises, for example, a solderable metal structure such as titanium-nickel-silver, chrome-nickel-gold, or the like.

In summary, a new switching device structure having charge-compensated trench regions, a trench control structure, and a sub-surface doped layer electrically coupling the trench control structure to the charge compensation trench regions has been described including a method of manufacture. The sub-surface doped region provides, among other things, a sub-surface primary conduction path, which isolates the conduction path from areas of stress and defects. This improves device performance. Additionally, this design simplifies the formation of an ohmic contact structure that contacts the charge-compensated trench regions.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for forming a semiconductor device comprising the steps of:

providing a body of semiconductor material having a major surface;

forming a vertical charge compensated structure in the body of semiconductor material extending from the major surface, where the vertical charge compensated structure includes at least one conduction layer of a first conductivity type and at least one compensation layer of a second conductivity type opposite the first conductivity type;

forming a trench control structure in the body of semiconductor material;

forming a doped region of the first conductivity type in the body of semiconductor material;

forming a body region of the second conductivity type in the body of semiconductor material, where the body region overlies the doped region; and forming a source region of the first conductivity type adjacent the body region, where the source region is interposed between the trench control structure and the vertical charge compensated structure, and where the trench control structure is configured to form a channel region within the body region, and where the doped region extends between a drain end of the channel region and the conduction layer.

2. The method of claim 1 further comprising the step of forming a conductive layer overlying the major surface and electrically coupled to the source region, the body region and the compensation layer.

3. The method of claim 1, where the step of providing the body of semiconductor material includes providing a body of semiconductor material, where the vertical charge compensated structure comprises a generally vertical trench having sidewalls and a lower surface, and where the at least one conduction layer overlies the sidewalls and the lower surface, and the at least one compensation layer overlies the at least one conduction layer.

4. The method of claim 1 further comprising the steps of:
forming a body contact region of the second conductivity type in the body region, where the body contact region overlies an upper portion of the vertical charge compensated structure; and
forming a conductive layer overlying the major surface and electrically coupled to the source region, the body contact region and the compensation layer.

5. The method of claim 1, where the step of forming the trench control structure occurs after the step of forming the vertical charge compensated structure.

6. The method of claim 1, where the step of forming the trench control structure occurs before the step of forming the vertical charge compensated structure.

7. The method of claim 1 where the step of forming the source region occurs after the step of forming the trench control structure.

8. A method for forming a semiconductor device comprising the steps of:
providing a body of semiconductor material having a vertical charge compensated structure where the vertical charge compensated structure includes at least one conduction layer of a first conductivity type and at least one compensation layer of a second conductivity type opposite the first conductivity type;
forming a body region of the second conductivity type in the body of semiconductor material, where the vertical charge compensated structure and the body regions are adjacent;
forming a source region of the first conductivity type within the body region;
forming a trench control structure in the body of semiconductor material, where the source region is interposed between the trench control structure and the vertical charge compensated structure, and where the trench control structure is configured to form a channel region within the body region; and
forming a doped region of the first conductivity type in the body of semiconductor material, where the doped region extends proximate from a drain end of the channel region to the at least one conduction layer.

9. The method of claim 8 further comprising the step of forming a conductive layer overlying the major surface and electrically coupled to the source region, the body region and the at least one compensation layer.

10. The method of claim 8 where the step of providing the body of semiconductor material includes providing a body of semiconductor material comprising the first conductivity type.

11. The method of claim 8 where the step of providing the body of semiconductor material includes providing a body of semiconductor material where the vertical charge compensation structure comprises a generally vertical trench having sidewalls and a lower surface, and where the at least one conduction layer overlies and adjoins the sidewalls and the lower surface, and where the at least one compensation layer overlies the at least one conduction layer.

12. The method of claim 11 further comprising the step of forming a buffer layer between the at least one conduction layer and the least one compensation layer.

13. The method of claim 8 further comprising the step of forming a body contact region of the second conductivity type in the body, where the body contact region overlies the at least one compensation layer.

14. The method of claim 8 where the step of providing the body of semiconductor material includes providing a body of semiconductor material comprising a semiconductor substrate of the first conductivity type and a semiconductor layer of the first conductivity type overlying the semiconductor substrate, and where the step of forming the doped region includes forming the doped region in the semiconductor layer and having a higher dopant concentration than the semiconductor layer.

15. A method for forming a semiconductor device comprising the steps of:
providing a body of semiconductor material having a major surface;
forming a trench extending from the major surface and having sidewalls and a lower surface;
forming a conduction layer of a first conductivity type semiconductor material overlying and adjoining the sidewalls and the lower surface;
forming a compensation layer of a second conductivity type semiconductor material overlying the conduction layer, where the second conductivity type is opposite to the first conductivity type to form a vertical charge compensation structure;
forming a doped region of the first conductivity type in the body of semiconductor material;
forming a body region of the second conductivity type in the body of semiconductor material adjacent to the vertical charge compensation structure, where at least a portion of the doped region underlies the body region;
forming a source region of the first conductivity type within the body region;
forming a trench control structure in the body of the semiconductor material, where the trench control structure is configured to form a channel region within the body region, and where the doped region extends between a drain end of the channel region and the conduction layer; and
forming a body contact region of the second conductivity type in the body region, where the body contact region overlies the vertical charge compensation structure and is coupled to the compensation layer.

16. The method of claim 15 where the step of providing the body of semiconductor material comprises providing a body of semiconductor material, where a portion of the body of semiconductor material where the body region is formed comprises the second conductivity type.

17. The method of claim 15 further comprising the step of forming a conductive layer overlying the major surface and electrically coupled to source region and the body contact region.

18. The method of claim 15 further comprising the step of forming a buffer layer between the conduction layer and the compensation layer.

* * * * *